(12) United States Patent
Cooper

(10) Patent No.: US 6,812,866 B1
(45) Date of Patent: Nov. 2, 2004

(54) DATA DECOMPRESSOR UTILIZING SEQUENTIALLY COUPLED LOGIC ELEMENTS

(75) Inventor: Albert B. Cooper, New York, NY (US)

(73) Assignee: Unisys Corporation, Blue Bell, PA (US)

(*) Notice: Subject to any disclaimer, the term of this patent is extended or adjusted under 35 U.S.C. 154(b) by 0 days.

(21) Appl. No.: 10/699,326

(22) Filed: Nov. 1, 2003

(51) Int. Cl.⁷ .............................................. H03M 7/38
(52) U.S. Cl. ............................................. 341/51; 341/50
(58) Field of Search ............................... 341/51, 50, 67

(56) References Cited

U.S. PATENT DOCUMENTS 5,717,394 A * 2/1998 Schwartz et al. ............ 341/51
6,148,038 A * 11/2000 Drost et al. ................ 375/324

* cited by examiner

Primary Examiner—Brian Young
Assistant Examiner—Joseph Lauture
(74) Attorney, Agent, or Firm—Michael B. Atlass; Mark T. Starr; Albert B. Cooper

(57) ABSTRACT

A matrix of single input OR-gates correspond to respective codes to be assigned to strings. The inputs of the OR-gates are coupled to respective outputs of a code decoder that is responsive to a fetched input code. The locations of a character and level table, respectively accessible by the code decoder outputs, store the extension characters of extended strings recorded in the decompressor. Outputs of OR-gates are selectively coupled to code decoder outputs through a matrix switch to sequentially couple OR-gate outputs to OR-gate inputs so that the characters of a string corresponding to the input code are provided from accessed locations of the table. An update extended string is recorded by coupling the output of the OR-gate corresponding to the next assignable code to the code decoder output corresponding to the previously received code. The first character of the string corresponding to the current code is stored in the table location accessible by the next assignable code.

18 Claims, 7 Drawing Sheets

DATA DECOMPRESSOR UTILIZING SEQUENTIALLY COUPLED LOGIC ELEMENTS

CROSS REFERENCE TO RELATED APPLICATIONS

U.S. patent application Ser. No. 10/195,795 "Matrix Implemented Data Compression Apparatus and Method" by Cooper, filed Jul. 15, 2002, discloses a matrix implementation for LZ type compressors.

U.S. patent application Ser. No. 10/271,196 "Data Compression Apparatus and Method Utilizing Tandem Coupled Matrices" by Cooper, filed Oct. 15, 2002, discloses a tandem coupled matrix implementation for LZ type compressors.

U.S. patent application Ser. No. 10/351,210 "Data Compressor Utilizing Switched Input Coincidence Elements" by Cooper, filed Jan. 25, 2003, discloses a matrix implementation for LZ type compressors utilizing switched input coincidence elements.

U.S. patent application Ser. No. 10/448,620 "Data Compressor Utilizing Switched Input Coincidence Elements Arranged In Virtual Levels" by Cooper, filed May 30, 2003, discloses a compressor similar to that of said Ser. No. 10/351,210 with virtual levels assigned to the coincidence elements.

Said Ser. Nos. 10/195,795; 101271,196; 10/351,210 and Ser. No. 10/448,620 are incorporated herein by reference.

BACKGROUND OF THE INVENTION

1. Field of the Invention

The invention relates to data compression and decompression systems based on the LZ data compression and decompression methodology and more particularly to the LZW decompression protocols.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, 31 Jul., 1990. TIFF is a development of Aldus Corporation and the name TIFF is a Trademark thereof. Reference to the TIFF specification is found in TIFF, Revision 6.0, Final—Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990. The V.42 bis standard is further described in an article entitled "V.42 bis: The New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S. Pat. No. 4,464,650 by Eastman et al., issued Aug. 7, 1984; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment the alphabet has an 8 bit character size supporting an alphabet of 256 characters. Thus, the characters have values of 0-255. The first available multiple character string code can, for example, be 258 where the codes 256 and 257 are utilized as control codes as is well known.

In the prior art dictionary based LZ decompression systems, data character strings are stored and accessed in the decompressor dictionary utilizing well known searchtree architectures and protocols. Typically, the searchtree is arranged in nodes where each node represents a character, and a string of characters is represented by a node-to-node path through the tree. The nodes are stored as linked locations in the dictionary, a location storing the character corresponding thereto with a code assigned to the terminal node. An input compressed code fetched by the decompressor accesses the terminal node and the character stored thereat is saved. The linked locations up the tree to the root are each accessed in turn saving the respective characters. As a result, the characters of the string represented by the fetched code are accessed in reverse order. A character reversal operation is required to provide the characters in appropriate order. Additionally, numerous dictionary accesses are required to recover the characters of a string.

Although the known dictionary architectures and protocols provide efficient data decompression systems, it is desirable to eliminate the requirement for character order reversal and to eliminate the numerous required dictionary accesses.

The data compressors of said Ser. Nos. 10/195,795; 10/271,196; 10/351,210 and Ser. No. 10/448,620 provide an improvement over the prior art by replacing the known dictionary architecture by matrices of logic elements thereby eliminating dictionary accesses. A data decompressor utilizing a matrix of logic elements to replace the known dictionary arrangements is not available in the prior art.

SUMMARY OF THE INVENTION

The present invention replaces the conventional dictionary arrangements with digital logic elements and switches to provide a new architecture and protocols which, it is believed, will improve the performance of LZ type data decompression systems. The embodiments of the present invention eliminate both dictionary accesses and character order reversal requirements. Additionally, the architecture of the present invention provides an efficient arrangement for performing the LZW exception case processing where a string of characters is not yet stored for a fetched input code.

The present invention is embodied in a data decompressor for decompressing an input stream of codes to recover an output stream of data characters corresponding thereto, a code corresponding to a string of data characters. The decompressor includes a code decoder with a plurality of code decoder outputs corresponding to a respective plurality of codes to be assigned to strings, the code decoder being responsive to an input code for selectively energizing a code decoder output in accordance with the input code. Further included in the decompressor is a plurality of logic elements corresponding to the respective plurality of codes, a logic element having an input and an output with the inputs of the logic elements coupled to the code decoder outputs, respectively. A character storage table is responsive to the code decoder outputs and has a plurality of storage locations for storing respective data characters. A storage location is accessed by a code decoder output to provide the data character stored therein.

A coupling arrangement is included for selectively coupling outputs of the logic elements to inputs thereof so that the data characters of the string corresponding to the input code are provided by the character storage table, thereby providing the output stream of data characters. The coupling arrangement selectively couples the outputs of the logic elements to inputs thereof so that energization of the code decoder output corresponding to the input code propagates through sequentially coupled logic elements to access storage locations thereby providing the data characters of the string corresponding to the input code.

An update extended string is recorded in the decompressor and a code assigned thereto by storing the first character of the string corresponding to the input code in the storage location of the character storage table accessible by the code decoder output corresponding to a next code to be assigned to a string. The coupling arrangement couples the output of the logic element corresponding to the next code to be assigned to the input of the logic element corresponding to the code received previously to the input code. The extended string comprising the string corresponding to the previously received code extended by the first character of the string corresponding to the input code is thereby recorded and the next code assigned thereto.

Exception case processing is performed for a currently fetched code to which a recorded string has not been assigned. The first character of the string corresponding to the code received previously to the currently fetched code is stored in the storage location of the character storage table accessible by the code decoder output corresponding to a next code to be assigned to a string. The coupling arrangement couples the output of the logic element corresponding to the next code to be assigned to the input of the logic element corresponding to the previously received code. An extended string corresponding to the currently fetched code is thereby recorded and the characters thereof outputted.

DESCRIPTION OF THE PREFERRED EMBODIMENTS

Figure 1:
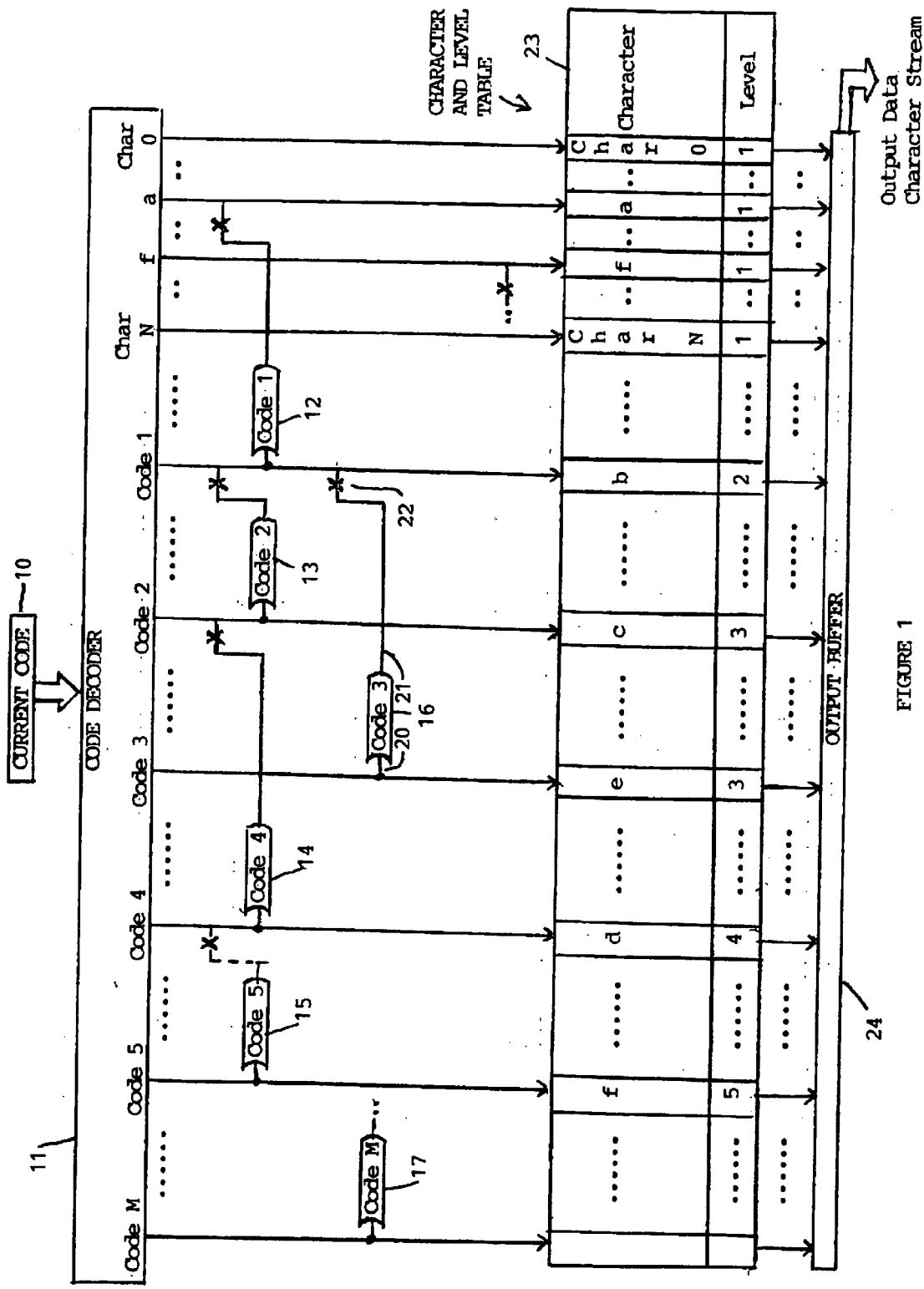
FIG. 1 is a schematic block diagram exemplifying principles of the present invention.
Figures 1A, 7:
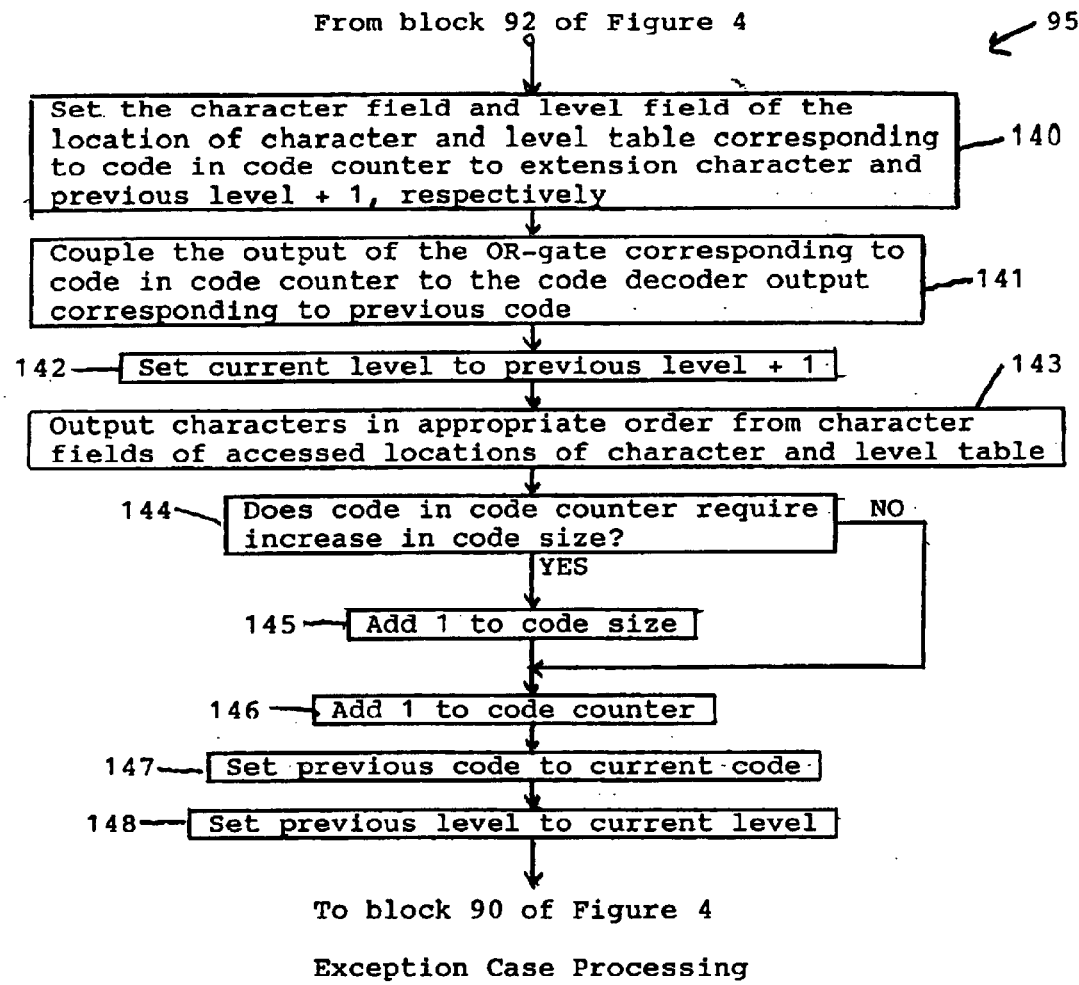
FIG. 1A is a chart of the strings recorded in the example of FIG. 1.
FIG. 7 is a control flow chart illustrating details of the exception case processing of FIG. 4.

Referring to FIGS. 1 and 1A, FIG. 1 illustrates a schematic block diagram exemplifying principles of the decompressor of the present invention and FIG. 1A provides a chart of the strings recorded in the decompressor. The codes of the input stream are fetched into a current code register 10. The input stream includes codes corresponding to multiple character strings and may include codes corresponding to single character strings. The codes for the single character strings are conveniently provided by the character values. Typically, the codes for the multiple character strings have values greater than the character values. For convenience, the term "compressed code(s)" is used herein to refer to multiple character and single character string codes.

An input code fetched into the current code register 10 is applied to a code decoder 11 that energizes a unique output thereof in accordance with the code applied thereto. The outputs of the code decoder 11 are accordingly denoted as Char 0 through Char N and Code 1 through Code M. The Char 0 through Char N outputs correspond to the character values of the N+1 characters of the alphabet over which decompression is being performed. The decoder outputs for the characters "a" and "f" are included for illustrative purposes. The Code 1 through Code M outputs correspond to assignable multiple character string codes where Code M is the maximum assignable code.

Logic elements 12–17 corresponding, respectively, to the multiple character string codes have inputs, such as the input 20, coupled, respectively, to the Code 1 through Code M outputs of the code decoder 11. Outputs of the logic elements, such as the output 21, are selectively coupled to logic element inputs through switches, such as switch 22. An output of a logic element, such as logic element 12, may be coupled through a switch to a character output of the code decoder 11 to implement recording of the "root" character of a string. Preferably, the logic elements are implemented by OR-gates such as the single input OR-gates illustrated.

The outputs of the code decoder 11 access respective locations of a-character and level table 23, each location utilized for storing a character value and an assigned level. Characters from accessed table locations are transferred into output buffer 24 to provide the recovered data characters of a string corresponding to the code in current code register 10. The largest assigned level in the accessed locations indicates to the output buffer 24 the number of characters in the string.

FIG. 1A indicates that the string "abcd" is represented by Code 4. When Code 4 is fetched into the current code register 10, the Code 4 output of the code decoder 11 is uniquely energized. The energization is propagated through OR-gate 14 and through sequentially coupled OR-gates 13 and 12 to the "a" line as illustrated. The energized Code 4 output of the code decoder 11 and the energized outputs of OR-gates 14–12 access the locations of the character and level table 23 as illustrated. The stored characters in the accessed locations are transferred to the output buffer 24 to provide the data characters "abcd" corresponding to fetched Code 4. The level 4 indication, which is the largest assigned level from the accessed locations, is provided to the output buffer 24 to indicate to the buffer the number of characters to output.

In a decompression cycle, an appropriate update extended string is recorded by extending the string recovered in the previous decompression cycle by the first character of the string recovered in the current decompression cycle. The next available string code is assigned to the update extended string.

For example, if in the current decompression cycle a string with first character of "f" is recovered, previous code is Code 4 and the next available code is Code 5; the appropriate update string to be recorded is "abcdf" with an assigned code of Code 5. This is implemented by coupling the output of OR-gate 15 to the input of OR-gate 14, as indicated by the dashed line connection, and storing the character "f" in the location of character and level table 23 accessible by the Code 5 output of code decoder 11. As illustrated, level 5 is assigned since the string corresponding to Code 5 is one character longer than the string corresponding to Code 4. A switch is illustrated coupled to the character "f" line to indicate that a string with first character "f" had previously been recorded.

As described above, FIG. 1A depicts the strings recorded in the exemplified decompressor illustrated in FIG. 1. For example, if Code 3 is fetched into the current code register 10, the string "abe" is output. This results from outputting the characters stored in the accessed locations of the character and level table 23 as illustrated. The locations are accessed by the energized Code 3 output of the code decoder 11 and the energized outputs of OR-gates 16 and 12.

It is appreciated that when a code is fetched into the current code register 10, the characters of the corresponding string are substantially instantaneously provided from the character and level table 23 to the output buffer 24 in the correct character order. This obviates the prior art disadvantages of numerous character recovery dictionary accesses and character order reversal procedures.

An exception case compressed code fetched into the current code register 10 is readily processed. In exception case processing, the fetched current code is equal to the next code to be assigned to a string and the string corresponding to the code is the string corresponding to previous code extended by the first character thereof. Thus, the first character of the string corresponding to previous code is stored in the location of the character and level table 23 accessible by the output of the code decoder 11 corresponding to the next code to be assigned. The output of the OR-gate corresponding to the next code to be assigned is coupled to the input of the OR-gate corresponding to previous code. In this manner the fetched exception case code is readily processed to recover, record and output the characters of the string corresponding thereto.

The best mode embodiments described below, utilizing the sequentially coupled logic element implementation architecture of the present invention are predicated, generally, on the LZW decompression methodology. The embodiments are implemented in a manner similar to that described above where the single character strings are initialized in the decompressor.

Figure 2:
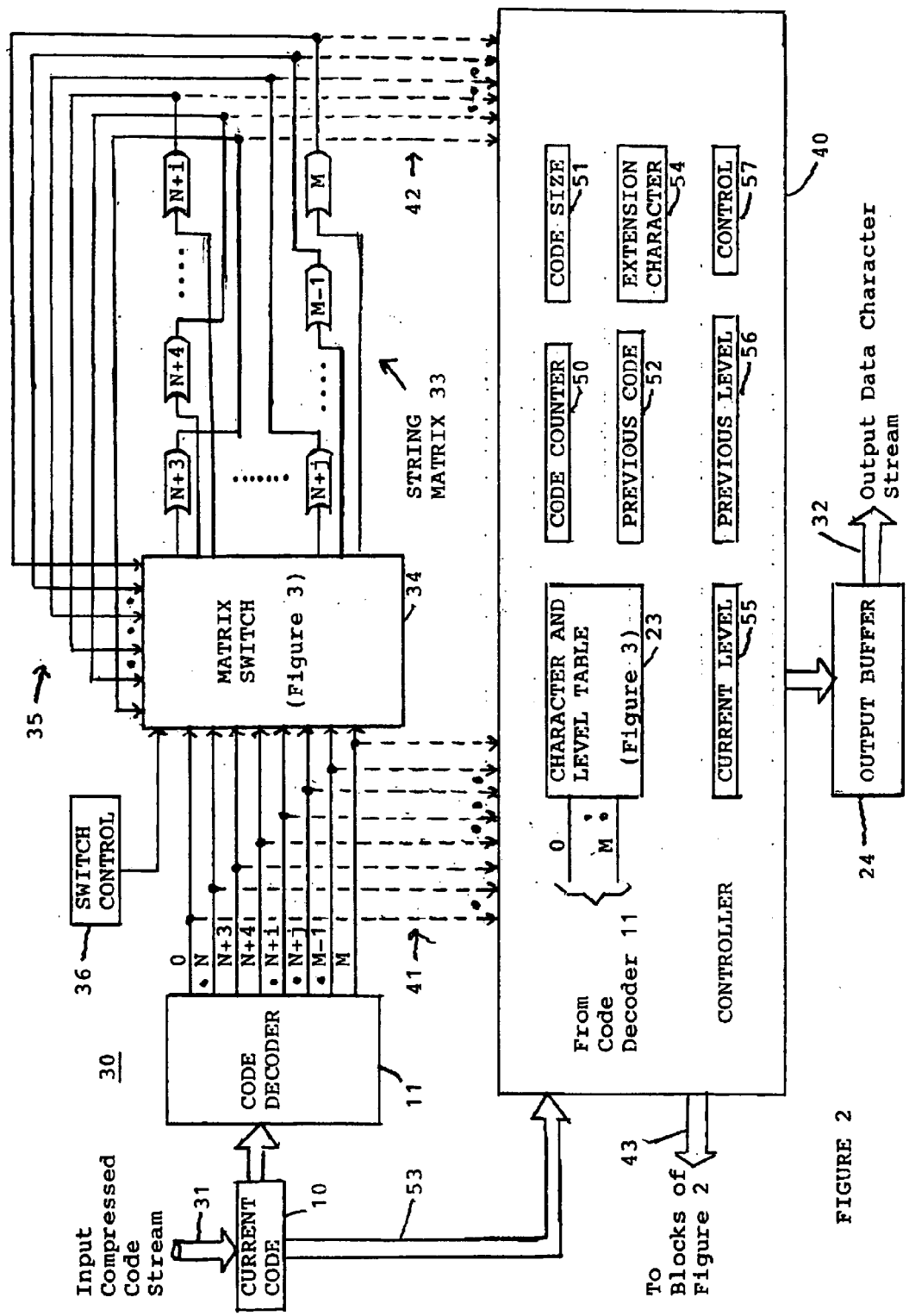
FIG. 2 is a schematic block diagram of a data decompressor for decompressing codes in accordance with the present invention.

Referring to FIG. 2, where like reference numerals indicate like components with respect to FIG. 1, a data decompressor 30 is illustrated that decompresses a stream of compressed codes applied at an input 31 into a recovered stream of data characters corresponding thereto provided at an output 32. The input compressed codes are fetched into the current code register 10 and applied to the code decoder 11.

A multiple character string is comprised of a prefix string of one or more characters followed by an extension character, where the prefix string has a prefix code associated therewith. Single character prefix strings conveniently utilize the character value as the prefix codes. In a manner to be further described, a string is recorded in the decompressor 30 and has a string code assigned thereto. A string code of N+3 is the first available string code assigned by the decompressor 30 and the string code of M is the maximum assignable string code. The codes N+1 and N+2 may be utilized as control codes as is well known.

Typically, LZW data decompressors are limited to 4096 string codes. When this limitation is applied to the present embodiments and when in the ASCII environment, the alphabet has an 8 bit character size supporting an alphabet of 256 characters having character values of 0-255. The first available multiple character string code may be 258 with the codes 256 and 257 utilized as control codes. In this example, the maximum assignable string code M is 4095.

The outputs of the code decoder 11 are denoted as 0 through M with illustrated intermediate values N, N+3, N+4, N+i, N+j and M−1. The codes N+1 and N+2 may be utilized as control codes and are not illustrated as code decoder outputs. As discussed above with respect to FIG. 1, the code decoder outputs 0 through N provide outputs for the respective single character strings. The outputs N+3 through M provide the multiple character string code outputs of which Code 1 through Code 5 of FIG. 1 are illustrative. In the ASCII environment, N will be 255 and the first available code N+3 for assignment to a multiple character string will be 258.

The decompressor 30 further includes a string matrix 33 comprised of a plurality of logic elements preferably implemented by single input OR-gates. The OR-gates of the string matrix 33 correspond, respectively to the assignable string codes N+3 through M as indicated by the legends. It is appreciated that the OR-gates 12–17 of FIG. 1 are in the string matrix 33.

The decompressor 30 further includes matrix switch 34 with a plurality of inputs coupled to receive the respective outputs 0 through M from code decoder 11 and a plurality of inputs coupled to receive, through leads 35, the respective outputs of the OR-gates N+3 through M of the string matrix 33. The matrix switch 34 includes a plurality of outputs coupled to the respective inputs of the string matrix OR-gates N+3 through M. As will be illustrated in more detail hereafter, the N+3 through M outputs of the code decoder 11 are coupled directly through the matrix switch 34 to the respective inputs of the OR-gates N+3 through M.

A switch control 36, coupled to the matrix switch 34, controls the matrix switch to selectively couple an OR-gate output to a code decoder output. In this manner, OR-gate outputs are selectively-coupled to OR-gate inputs. It is appreciated that a code decoder output can have a plurality of the OR-gate outputs coupled thereto. It is further appreciated that the switches of FIG. 1, such as the switch 22, are included in the matrix switch 34. Further details of the matrix switch 34 will be described with respect to FIG. 3.

The decompressor 30 includes a controller 40 responsive to control inputs represented as dashed lines. The controller 40 receives control inputs 41 from the 0 through M outputs of the code decoder 11 and control inputs 42 from the outputs of the OR-gates N+3 through M. The controller 40 provides control signals to the blocks of FIG. 2 via a bus 43 to control the operations of the decompressor 30 in a manner to be described.

The controller 40 includes the character and level table 23 discussed above with respect to FIG. 1. Further details of the character and level table 23 including the interconnections with the code decoder 11 and the output buffer 24 will be described with respect to FIG. 3.

Further included in the controller 40 is a code counter 50 for registering the next code to be assigned to an extended strings to be recorded in the decompressor 30. The code counter sequentially generates code values for the strings and the codes in the code counter are utilized to process incoming compressed codes in a manner to be described. The code counter 50 indicates the code corresponding to the appropriate OR-gate used in recording an extended string to be stored.

The code counter is initialized to the first available code N+3 and is incremented for each recorded string until the maximum assignable code M is exceeded. Any convenient mechanism such as counter overflow can be utilized to detect that the code counter 50 has exceeded the maximum assignable code. When this occurs the decompressor 30 continues to decompress the input stream without recording additional strings until the decompressor is reinitialized. At reinitialization, the code counter 50 is reset to the first available string code.

The controller 40 further includes a code size register 51 utilized, as is well known, to control the number of bits in which the decompressor 30 receives input compressed codes. The code size in the code size register 51 is set in accordance with the count in the code counter 50. The code size is set to an initial value and incremented at predetermined codes of the code counter until a maximum code size is attained. In an ASCII variable length code implementation, the code size may begin with 9 bits and sequentially. increase to 10, 11 and 12 bits at codes 512, 1024 and 2048, respectively. It is appreciated that a fixed code size may also be utilized to implement the embodiments.

The controller 40 includes a previous code register 52 into which current code from the current code register 10 is transferred, via a bus 53, at the end of a decompression cycle. Further included is an extension character register 54 for holding the first character of a string recovered in a current decompression cycle. Previous code and extension character are utilized in recording an update extended string in a current compression cycle and in performing exception case processing in a manner to be described.

Further included in the controller 40 is a current level register 55 and a previous level register 56. The current level register 55 conveniently holds the largest level accessed from the character and level table 23 during a character recovery process to inform the output buffer 24 of the number of characters in a recovered string. Previous level is utilized in a current decompression cycle to set the appropriate level in the character and level table 23 for an update extended string. At the end of a decompression cycle, current level from the current level register 55 is transferred to the previous level register 56.

The controller 40 also includes control circuit 57 for controlling the detailed operations to be executed by the decompressor 30 in accordance with the flow chart diagrams of FIGS. 4–7 to be described. The control circuit 57 is considered as containing appropriate circuitry, such as state machines, or appropriate software to control execution of the operations.

Figure 3:
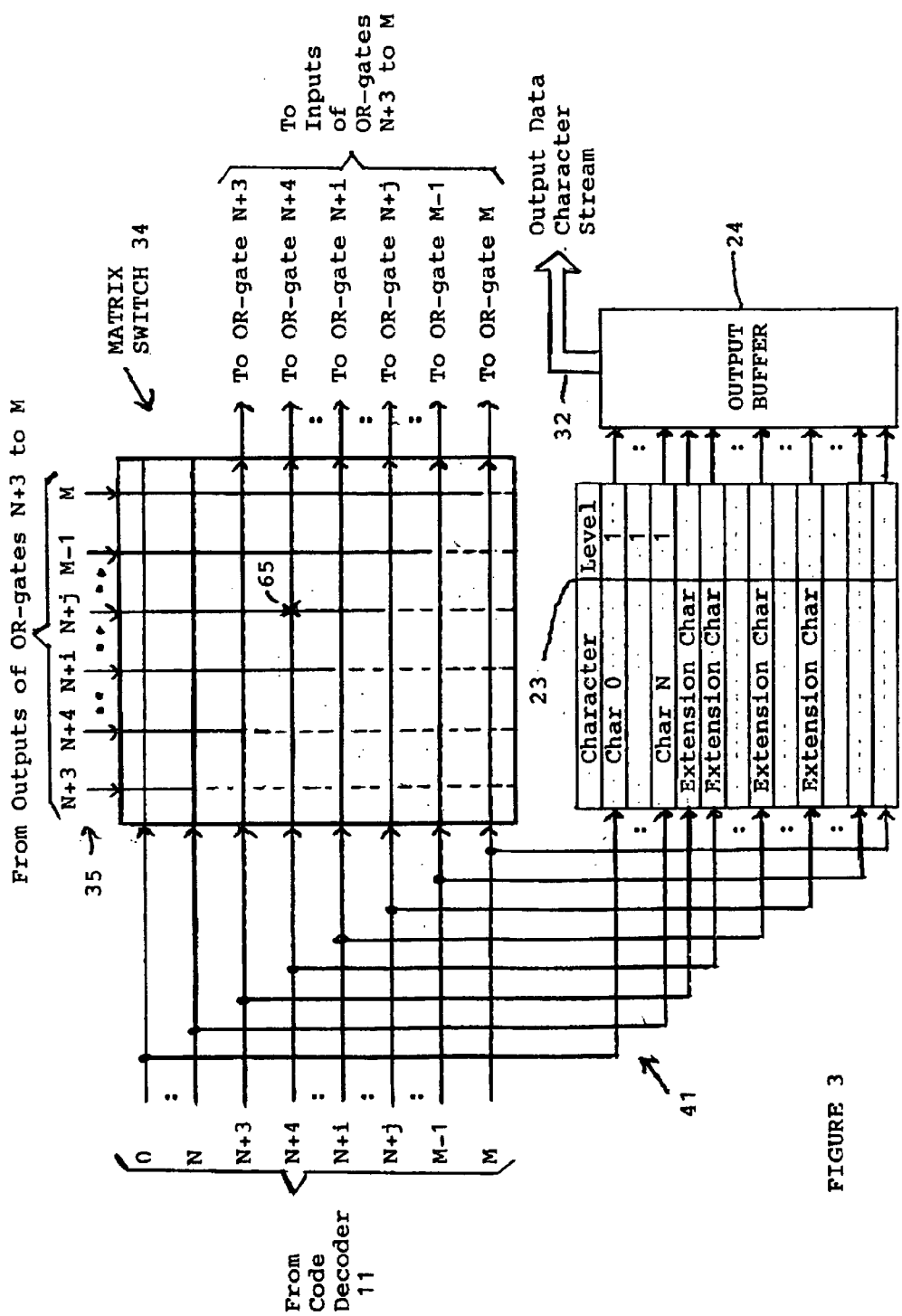
FIG. 3 is a schematic block diagram illustrating details of the matrix switch and character and level table components of FIG. 2 and the interconnections therebetween.

Referring to FIG. 3, where like reference numerals indicate like components with respect to FIG. 2 and with continued reference to FIG. 2, further details of the matrix switch 34 and the character and level table 23 are illustrated. FIG. 3 also provides interconnection details with respect to the code decoder 11, character and level table 23, matrix switch 34 and the OR-gates of the string matrix 33.

The outputs of the code decoder 11 access the respective locations of the character and level table 23 which is illustrated with the first N+1 locations thereof initialized with the respective characters of the alphabet. These single character strings have level 1 assigned thereto. The initialized locations are accessed by the corresponding character outputs 0–N of the code decoder 11. The table locations accessed by the multiple character string code outputs N+3 through M of the code decoder 11 are utilized for storing appropriate extension characters and levels in a manner to be described further with respect to FIGS. 4–7.

The matrix switch 34 is comprised of rows providing respective inputs from the outputs of the code decoder 11 and outputs to the inputs of the OR-gates N+3 through M as illustrated. The rows of the matrix switch 34 provide respective connections from the N+3 through M outputs of the code decoder 11 to the inputs of the OR-gates N+3 through M. The matrix switch 34 further comprises columns providing respective inputs from the outputs of the OR-gates N+3 through M.

A column and row intersection is a controllable switch connection, such as the switch connection 65, actuated by the switch control 36. The switch control 36 is operative for selectively coupling a column to a row. A row may have a plurality of columns coupled thereto. In this manner the switch control 36 is operative for selectively coupling an OR-gate output to a code decoder output. A code decoder output may have a plurality of OR-gate outputs coupled thereto. It is appreciated that by the described interconnections, OR-gate outputs are selectively coupled to OR-gate inputs.

For example, the switch connection 65 connects the output of OR-gate N+j to the input of OR-gate N+4. The switch connection 65 therefore is utilized in recording the extended string having the prefix string N+4 and the extension character stored in the location of the character and level table 23 accessed by code decoder output N+j. The code N+j is thus assigned to the extended string.

It will be appreciated from the operational descriptions given below with respect to FIGS. 4–7 that an OR-gate corresponding to a string code will have the output thereof selectively coupled to a code decoder output corresponding to a lower valued string code or to a character value. For this reason, the columns of the matrix switch 34 are illustrated partially by dashed lines indicating that controllable switch connections are not required at these intersections.

Briefly, the operation of the decompressor 30 is as follows. The decompressor 30 is initialized by setting the code counter 50 to the first assignable string code and by setting the code size register 51 to the initial code size. The character and level table 23 is initialized to the individual characters of the alphabet and the switch connections in the matrix switch 34 are cleared.

Compressed codes are fetched to the current code register 10 utilizing the number of bits determined by the code size in the code size register 51. In accordance with LZW compression and decompression protocols, the first fetched compressed code will be a character value and the character is output from the character field of the accessed location of the character and level table 23. In preparation for following decompression cycles, the extension character register 54 is set to the outputted character, the previous level register 56 is set to 1 and the previous code register 52 is set to current code.

In a subsequent decompression cycle a fetched code is examined to determine if it is a character value, and if not, if the fetched code is less than the code in the code counter 50.

If the fetched code is a character value, the single character string is processed. Accordingly, the current level register 55 is set to 1, the character is output from the character field of the accessed location of the character and level table 23 and the extension character register 54 is set to the outputted character.

An update extended string is recorded by coupling the output of the OR-gate corresponding to the code in the code counter 50 to the output of the code decoder 11 corresponding to previous code and by setting the character and level fields of the location of the character and level table 23 corresponding to the code in the code counter 50 to extension character and previous level +1, respectively.

The decompression cycle concludes by incrementing the code counter 50, setting the previous code register 52 to current code and setting the previous level register 56 to current level.

If the fetched code is not a character value but is less than the code in the code counter, a multiple character string is processed. Accordingly, the current level register 55 is set to the largest level from the level fields of the accessed locations of the character and level table 23, the characters of the string are output from the character fields of the accessed locations and the extension character register 54 is set to the character from the character field of the accessed level 1 location of the character and level table 23. An update extended string is recorded and the decompression cycle concluded in the manner described with respect to single character string processing.

If the fetched code is not a character value and is not less than the code in the code counter, exception case processing is performed. The exception case occurs when the string corresponding to the fetched code is not yet recorded in the decompressor. The exception case is implemented by recording the string corresponding to the fetched code and then outputting the characters thereof. The appropriate string is recorded in the manner described above with respect to update extended string recording during single character string processing. The characters of the string are output in the manner described above with respect to multiple character string processing. In exception case processing the current level register 55 is set to previous level +1 and the decompression cycle is concluded in the manner described above with respect to single character string processing.

Figure 4:
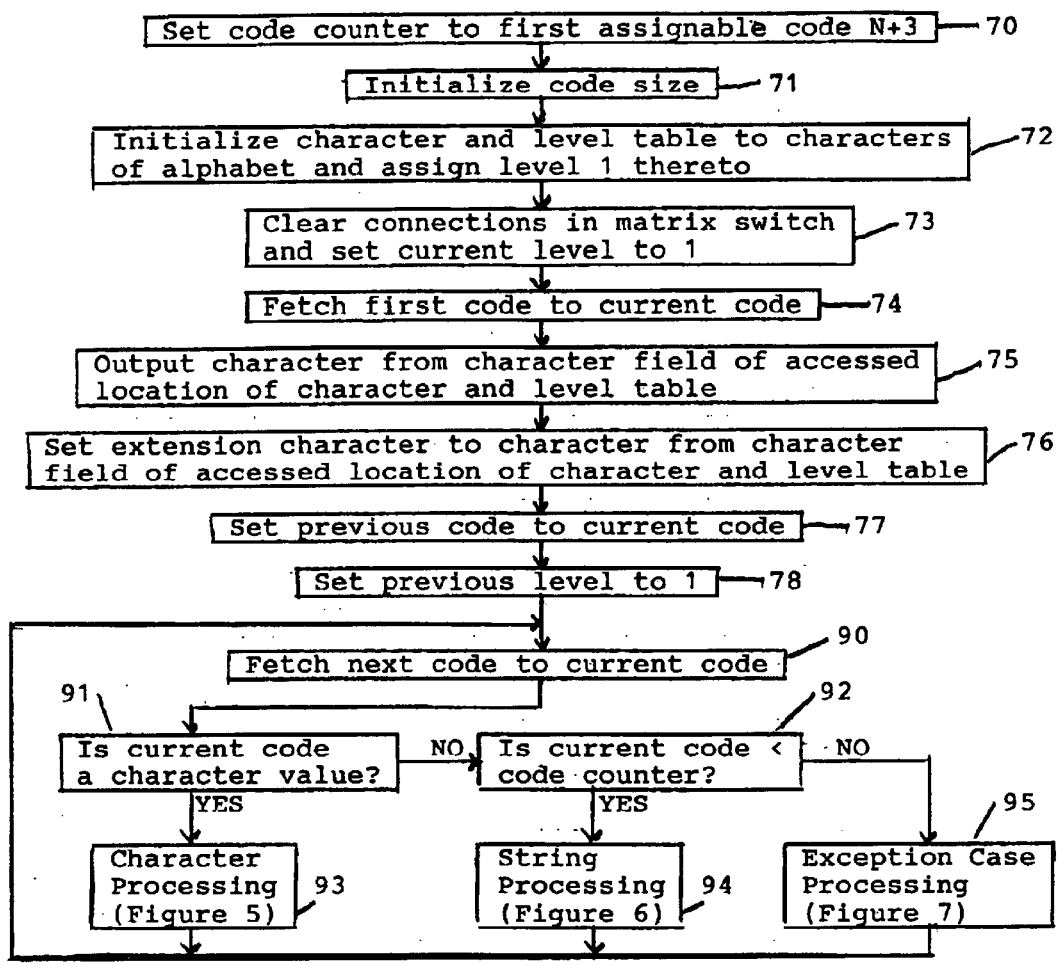
FIG. 4 is a control flow chart illustrating operations executed by the decompressor of FIG. 2 so as to perform data decompression in accordance with the present invention.

Referring to FIG. 4, with continued reference to FIGS. 1–3, a control flow chart is illustrated showing the detailed operations to be executed by the decompressor 30. Control 57 in the controller 40 is considered as containing appropriate circuitry, such as state machines, or appropriate software, to control execution of the operations. The control flow chart of FIG. 4 is predicated on a variable length code and the code size register 51 is utilized to this effect. In an ASCII variable length code implementation, the code size may begin with 9 bits and sequentially increase to 10, 11 and 12 bits at codes 512, 1024 and 2048, respectively. It is appreciated that a fixed code size may also be utilized with appropriate modifications to the embodiments.

Control enters a block 70 whereat the code counter 50 is set to a first assignable code N+3. In the ASCII environment, the first assignable code may be 258. At a block 71, the code size register 51 is initialized to the beginning code size, for example, 9 bits in the ASCII environment. At a block 72, the first N+1 locations of the character and level table 23 are initialized to the respective N+1 characters of the alphabet over which, decompression is being performed and the level fields of the initialized table locations are set to 1. At a block 73, utilizing the switch control 36, all of the connections in the matrix switch 34 are opened and the current level register 55 is set to 1.

Processing proceeds to a block 74 whereat the first input compressed code is fetched to the current code register 10 utilizing the number of bits determined by code size. Because of the operations of LZW compressors compatible with the decompressor of the present invention, the first fetched code represents a single character string.

Accordingly, at a block 75, the character corresponding to current code is provided at the decompressor output 32 and is preferably provided from the character field of the accessed location of the character and level table 23. The output buffer 24 is informed by current level that only a single character will be outputted. At a block 76, the extension character register 54 is set to the character from the character field of the location of the character and level table 23 accessed at the block 75. At a block 77, the code in the current code register 10 is transferred to the previous code register 52 via the bus 53 and, at a block 78, the previous level register 56 is set to 1.

At a block 90, the next input compressed code is fetched to the current code register 10. It is appreciated that the code fetched to the current code register 10 may represent either a single character string or a multiple character string. Such strings may be distinguished from one another by the value of the code. Generally, multiple character strings are represented by codes that are greater than or equal to the first assignable code discussed above with respect to the block 70. The code for a single character string generally has a value equal to, or representative of, the single character and therefore has a value less than the first assignable code. In an ASCII environment, a code representing a single character has a value less than 256 while a code representing a multiple-character string has a value that is not less than 256.

Accordingly, at a block 91, the code in the current code register 10 is tested to determine if current code represents a character value. Conveniently, the test of the block 91 may be to determine if current code is less than a predetermined value that is greater than the character values. If so, the YES branch is taken from the block 91 to a block 93 whereat character processing is performed. Details of the character processing of block 93 will be discussed with respect to FIG. 5.

If, at the block 91, current code does not represent a character value, the NO branch from the block 91 is taken to a block 92. At the block 92, current code in the current code register 10 is compared to the code in the code counter 50 to determine if current code is less than code counter. If current code is less than code counter, a multiple character string corresponding to current code has been recorded in the decompressor 30 and the YES branch from the block 92 is taken to a block 94 whereat string processing is performed. Details of the string processing of the block 94 will be discussed with respect to FIG. 6.

If, at the block 92, current code is not less than code counter, the NO branch is taken from the block 92 to a block 95 at which exception case processing is invoked. Exception case processing is invoked in the embodiments described herein when the received compressed code in the current code register 10 is equal to the code in the code counter 50. When the exception case occurs, the string corresponding to current code is not yet recorded in the decompressor 30. The exception case processing of block 95 will be described in detail with respect to FIG. 7 and is predicated on the exception case LZW data decompression processing of, for example, said patent 4,558,302.

After the processing of block 93, 94 or 95, control returns to the block 90 to fetch the next input compressed code to begin the next decompression cycle.

Figure 5:
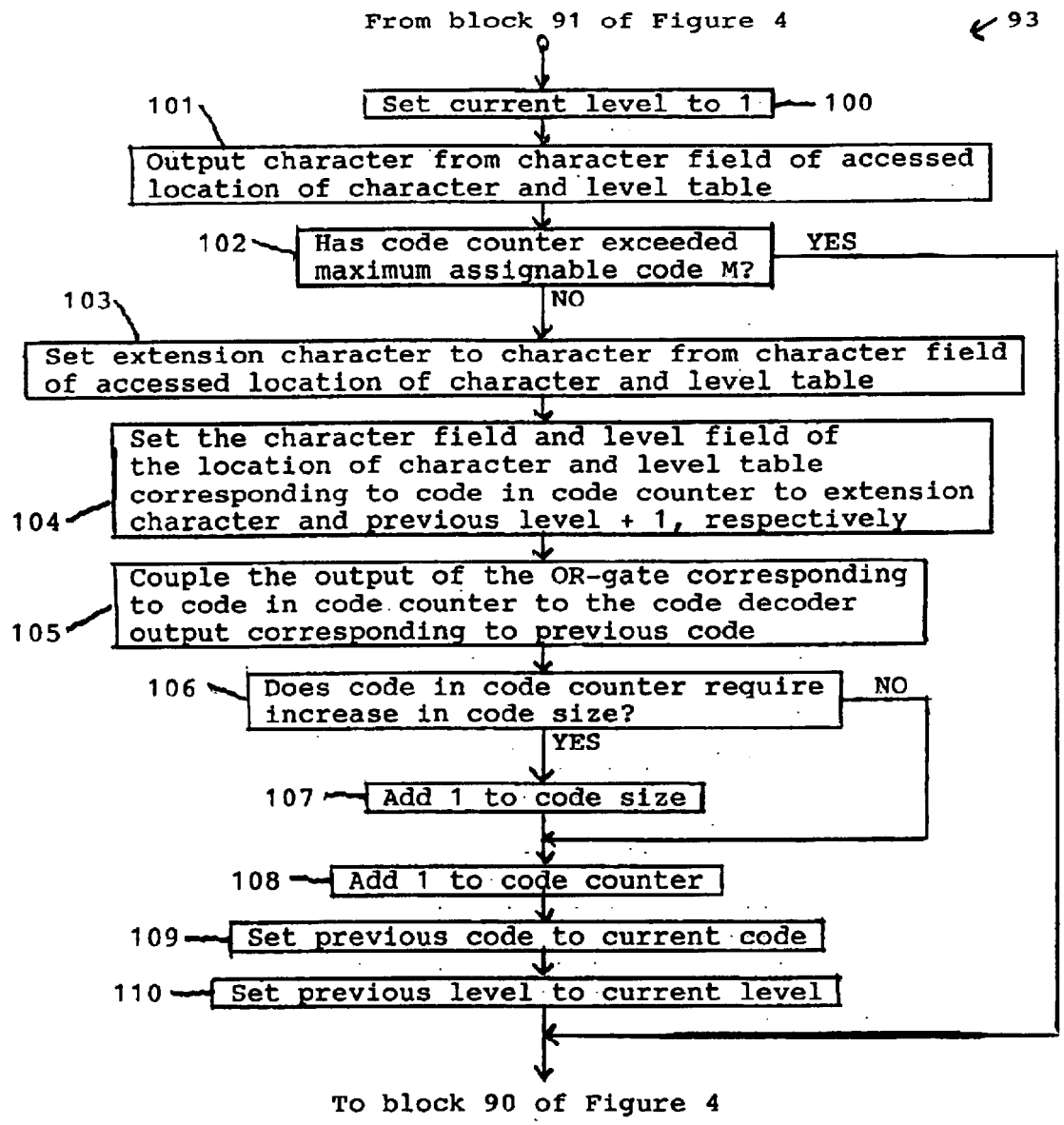
FIG. 5 is a control flow chart illustrating details of the character processing of FIG. 4.

Referring to FIG. 5, with continued reference to FIGS. 1–4, details of the character processing of block 93 of FIG. 4 are illustrated. Processing enters a block 100 from the YES branch of block 91 of FIG. 4. At the block 100, the current level register 55 is set to 1 so as to appropriately control the output buffer 24 to output the single character of the string corresponding to current code. Accordingly, control proceeds to a block 101 whereat the character from the character field of the accessed location of the character and level table 23 is provided, via the output buffer 24, to the decompressor output 32.

Control proceeds from the block 101 to a block 102 whereat the controller 40 determines if any codes remain available to be assigned to update extended strings to be recorded in the decompressor. This may be done, for example, by determining if the code counter 50 has exceeded the maximum assignable code M.

If a next code is available to be assigned, control proceeds via the NO branch of the block 102 to a block 103 whereat the extension character register 54 is set to the character from the character field of the location of the character and level table 23 accessed at block 101. The extension character register 54 is set so as to provide the appropriate extension character for the update extended string to be recorded at blocks 104 and 105 as well as to provide the appropriate extension character for exception case processing if so required in the next decompression cycle.

Control proceeds from the block 103 to blocks 104 and 105 whereat an appropriate update extended string is recorded in the decompressor 30 and assigned the next available string code.

Specifically, at the block 104, the character field and the level field of the location of the character and level table 23 corresponding to the code in the code counter 50 are set, respectively, to the extension character in the extension character register 54 and to the level, increased by 1, in the previous level register 56.

Additionally, at the block 105, the output of the OR-gate corresponding to the code in the code counter 50 is coupled, in the matrix switch 34, to the output of the code decoder 11 corresponding to previous code in the previous code register 52. In this manner, if previous code is a multiple character string code, the output of the OR-gate corresponding to the code in the code counter is coupled to the input of the OR-gate corresponding to previous code.

Control proceeds from the block 105 to a block 106 whereat the code in the code counter 50 is tested to determine if an increase in code size is required. If so, control continues to a block 107 whereat the code size register 51 is incremented by 1. If an increase in code size is not required at the block 106, the block 107 is bypassed to continue the operations at a block 108. At the block 108, the code counter 50 is incremented by 1.

Processing proceeds from the block 108 to blocks 109 and 110 whereat the previous code register 52 is set to the code in the current code register 10 and the previous level register 56 is set to the level in the current level register 55, respectively. Control returns from the block 110 to the block 90 of FIG. 4 to fetch the next input code for the next decompression cycle.

If at the block 102, the code counter 50 has exceeded the maximum assignable code M, control returns directly from the block 102 to the block 90 of FIG. 4 bypassing the operations of blocks 103–110. After the maximum code M has been assigned to an update extended string, advancing the code counter 50 is terminated, no further extended strings are recorded and exception case processing will not be invoked. The decompressor 30 continues to decompress input codes utilizing the already recorded strings until the decompressor is cleared by returning to block 70 of FIG. 4.

Figure 6:
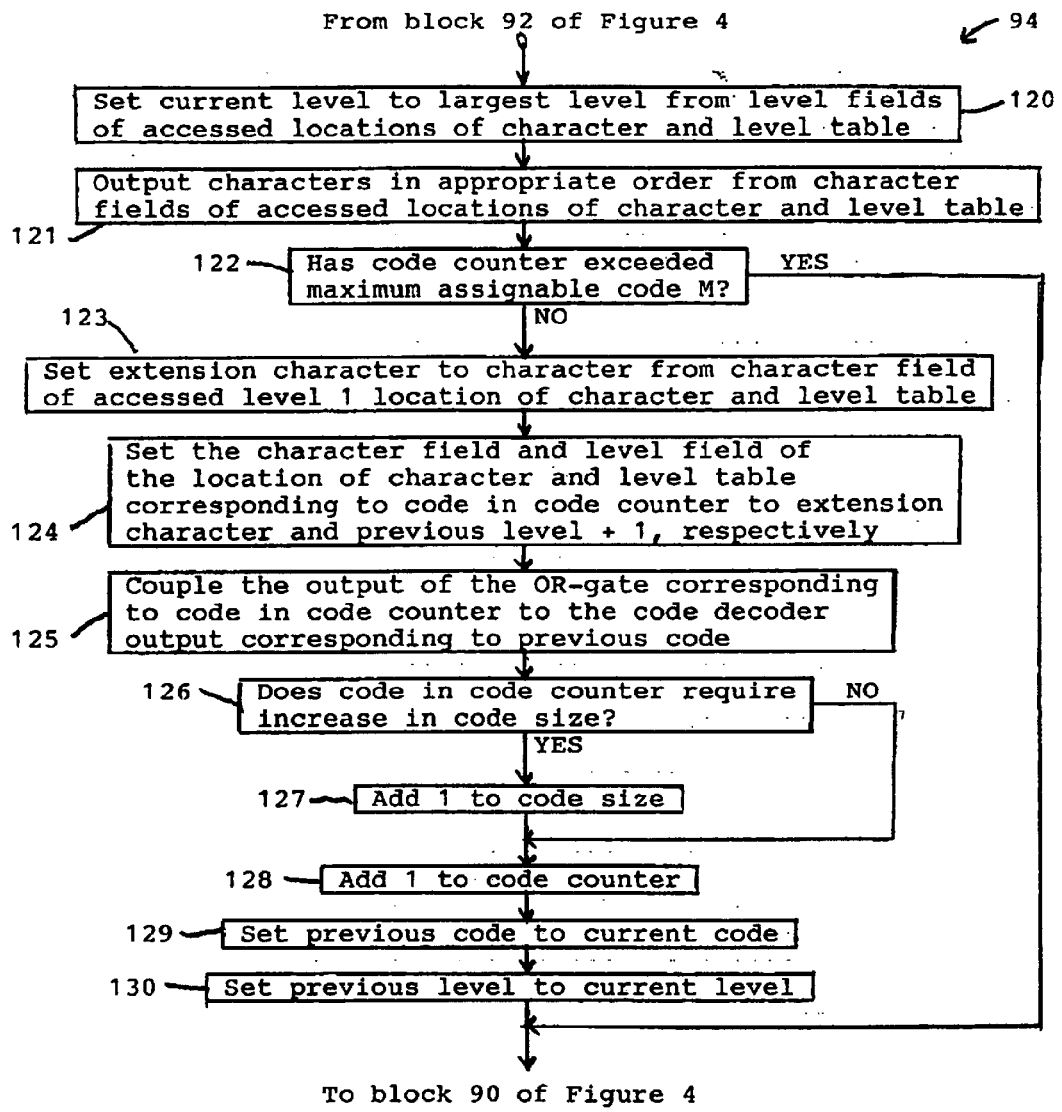
FIG. 6 is a control flow chart illustrating details of the string processing of FIG. 4.

Referring to FIG. 6, with continued reference to FIGS. 1–5, details of the string processing of block 94 of FIG. 4 are illustrated. Processing enters a block 120 from the YES branch of block 92 of FIG. 4. At the block 120, the current level register 55 is set to the largest level from the level fields of the accessed locations of the character and level table 23. Current level denotes the number of characters in the multiple character string corresponding to current code and informs the output buffer 24 of the number of characters that will be outputted.

Processing proceeds from the block 120 to a block 121 whereat the characters from the character fields of the accessed locations of the character and level table 23 are provided, via the output buffer 24, to the decompressor output 32. It is appreciated from the above descriptions that the characters of the string corresponding to current code are provided in the correct order from the character and level table 23 to the output buffer 24.

Control proceeds from the block 121 to a block 122. The processing of blocks 122–130 is substantially the same as that described above with respect to the corresponding blocks 102–110 of FIG. 5. It is appreciated, however, that with respect to the block 123, the extension character register 54 is set to the character from the character field of the accessed level 1 location of the character and level table 23.

Because of the similarity in the processing of FIGS. 5 and 6, an alternative embodiment of the invention may be configured utilizing the same resources to perform the combined operations of these Figures. In the alternative embodiment, block 100 of FIG. 5 is subsumed into block 120 of FIG. 6 since the largest level from the level fields of the accessed table locations for a single character string is level 1. For similar reasons, block 103 of FIG. 5 is subsumed into block 123 of FIG. 6. In FIG. 4, blocks 91 and 93 are eliminated with control going from block 90 to block 92. The string processing of block 94 subsumes the single character string processing.

Referring to FIG. 7, with continued reference to FIGS. 1–6, details of the exception case processing of block 95 of FIG. 4 are illustrated. In the exception case processing of the described embodiments, the string corresponding to current code is recorded in the decompressor 30 at the blocks 140 and 141 and the characters of the string are thereafter outputted at the block 143.

Accordingly, control enters the block 140 from the NO branch of the block 92 of FIG. 4. The processing of blocks 140 and 141 is the same as that described above with respect to the blocks 104 and 105 of FIG. 5 and the blocks 124 and 125 of FIG. 6. It is noted that the extension character register 54 had been set to the appropriate string extension character in the previous decompression cycle, for example, at block 123 of FIG. 6.

Control proceeds from the block 141 to a block 142 at which the current level register 55 is set to a level that is one greater than the level in the previous level register 56. It is appreciated that the current level set in the block 142 indicates the number of characters in the string recorded at the blocks 140 and 141.

Control proceeds from the block 142 to a block 143 whereat the characters of the string are outputted in the manner described above with respect to the block 121 of FIG. 6. From the block 143 control proceeds to a block 144. The processing of blocks 144–148 is the same as that described above with respect to the blocks 106–110 of FIG. 5.

In accordance with LZW exception case protocols, after the code in the code counter 50 has exceeded the maximum assignable code M, exception case processing will not occur. In FIG. 4, therefore, the NO branch from block 92 will not be taken since a received input code will be less than the code counter that has exceeded code M. This will continue until the system is reset by returning to block 70 of FIG. 4.

Although the above embodiments of the present invention are explained in terms of the matrix switch 34, other coupling arrangements may alternatively be utilized to effect the above described connections. Additionally, although the preferred embodiments utilize single input OR-gates, other appropriate logic elements may alternatively be used. Furthermore, the code decoder 11 preferably includes appropriate output drivers or isolation elements so that the propagation of the energization of a code decoder output through sequentially coupled OR-gates is not affected by the non-energized code decoder outputs.

It is appreciated from the above that the characters of a string have respective consecutive levels assigned thereto beginning with level 1 at the root and increasing by 1 for each subsequent character. Thus, the level of the last character of the string indicates the number of characters in the string. It is further appreciated that the levels are assigned for implementation convenience and that other arrangements may be utilized to the same effect.

It is appreciated that the above-described decompressor is compatible with the compressed code output provided by a standard LZW compressor and that the data character stream corresponding to the compressed code is recovered thereby. Furthermore, although the above disclosed embodiments are described utilizing LZW data decompression protocols, it is appreciated that the architecture of the present invention can be readily utilized with other data decompression protocols such as, for example, LZ2.

The embodiments of the present invention are substantially universal with respect to alphabet size. With N as the largest character value in an N+1 character alphabet, smaller alphabets are accommodated by appropriately initializing the character and level table 23 with the alphabet characters. For example, if N is 255 in an ASCII alphabet, the first assignable code N+3 may be 258. If N is 3 in a 4 character alphabet, the first assignable code N+3 may be 6. Of course sufficient OR-gates should be included in the design to accommodate the assignable codes. Specifically, OR-gates should be included in the string matrix 33 for all of the multiple character string codes with the inputs thereof coupled to the appropriate outputs of the code decoder.

It is further appreciated that decompression can be performed over any size alphabet having any corresponding character bit size. For example, the data characters can be textual data, image pixel data or bit map data. The input data can also be binary characters over the two-character binary alphabet 1 and 0 having a 1-bit size character.

While the invention has been described in its preferred embodiments, it is to be understood that the words which have been used are words of description rather than of limitation and that changes may be made within the purview of the appended claims without departing from the true scope of the invention in its broader aspects.

What is claimed is:

1. A data decompression apparatus for decompressing an input stream of codes to recover an output stream of data characters corresponding thereto, a code corresponding to a string of data characters, comprising code decoder means including a plurality of code decoder outputs corresponding to a respective plurality of codes to be assigned to strings, said code decoder means responsive to an input code for selectively energizing a code decoder output in accordance with said input code, a plurality of logic elements corresponding to said respective plurality of codes, a logic element having an input and an output, the inputs of said logic elements being coupled to respective code decoder outputs, character storage means responsive to the code decoder outputs and having a plurality of storage locations for storing respective data characters, a storage location being accessed by a code decoder output to provide the data character stored therein, and coupling means for selectively coupling outputs of said logic elements to inputs thereof so that the data characters of the string corresponding to said input code are provided by said character storage means, thereby providing said output stream of data characters.

2. The apparatus of claim 1 wherein said coupling means comprises means for selectively coupling outputs of said logic elements to inputs thereof so that energization of the code decoder output corresponding to said input code propagates through sequentially coupled logic elements to access storage locations of said character storage means to provide the data characters of the string corresponding to said input code.

3. The apparatus of claim 1 further including means for recording an extended string and assigning a code thereto, comprising means for storing the first character of the string corresponding to said input code in the storage location of said character storage means accessible by the code decoder output corresponding to a next code to be assigned to a string, said coupling means being operative for coupling the output of the logic element corresponding to said next code to the input of the logic element corresponding to the code received previously to said input code, so as to record in said data decompression apparatus the extended string comprising the string corresponding to the previously received code extended by said first character and to assign said next code thereto.

4. The apparatus of claim 1 further including means for processing a currently fetched code to which a recorded string has not been assigned, comprising means for storing the first character of the string corresponding to the code received previously to said currently fetched code in the storage location of said character storage means accessible by the code decoder output corresponding to a next code to be assigned to a string, said coupling means being operative for coupling the output of the logic element corresponding to said next code to the input of the logic element corresponding to the previously received code, so as to record in said data decompression apparatus an extended string corresponding to said currently fetched code and to output the characters thereof.

5. The apparatus of claim 4 wherein said means for processing said currently fetched code is operative to record the extended string comprising the string corresponding to the previously received code extended by said first character and to assign said next code thereto.

6. The apparatus of claim 1 wherein said coupling means comprises means for selectively coupling outputs of said logic elements to code decoder outputs.

7. The apparatus of claim 6 further including means for recording an extended string and assigning a code thereto, comprising means for storing a first character of the string corresponding to said input code in the storage location of said character storage means accessible by the code decoder output corresponding to a next code to be assigned to a string, said coupling means being operative for coupling the output of a logic element corresponding to said next code to the code decoder output corresponding to a code received previously to said input code, so as to record in said data decompression apparatus the extended string comprising the string corresponding to the previously received code extended by said first character and to assign said next code thereto.

8. The apparatus of claim 6 further including means for processing a currently fetched code to which a recorded string has not been assigned, comprising means for storing a first character of the string corresponding to the code received previously to said currently fetched code in the storage location of said character storage means accessible by the code decoder output corresponding to a next code to be assigned to a string, said coupling means being operative for coupling the output of a logic element corresponding to said next code to the code decoder output corresponding to a previously received code, so as to record in said data decompression apparatus an extended string corresponding to said currently fetched code and to output the characters thereof.

9. The apparatus of claim 6 wherein said data characters are from an alphabet of data characters, and said plurality of code decoder outputs includes further code decoder outputs corresponding to the respective data characters of said alphabet.

10. The apparatus of claim 9 wherein said coupling means is operative to couple the output of a logic element to one of said further code decoder outputs to record a string with a root character corresponding to said one of said further code decoder outputs.

11. The apparatus of claim 9 wherein said character storage means includes initialized locations accessible by said further code decoder outputs and storing said data characters of said alphabet, respectively.

12. The apparatus of claim 6 wherein said coupling means comprises a matrix switch.

13. The apparatus of claim 12 wherein said matrix switch comprises a plurality of controllable switches for selectively coupling the outputs of said plurality of logic elements to said code decoder outputs, a controllable switch coupling the output of a logic element corresponding to a particular code to a code decoder output corresponding to a code less than said particular code.

14. The apparatus of claim 1 further including means for assigning a level to a data character of a string, the level assigned to a last character of the string denoting a number of data characters comprising the string.

15. The apparatus of claim 14 wherein an extended string is comprised of a prefix string of at least one data character followed by an extension character, said assigning means being operative to assign a level to said extension character that is one greater than the level assigned to the last character of said prefix string.

16. The apparatus of claim 1 wherein said plurality of logic elements comprises a plurality of OR-gates.

17. The apparatus of claim 16 wherein said plurality of OR-gates comprises a plurality of single input OR-gates.

18. The apparatus of claim 1 wherein said plurality of logic elements comprises a matrix of logic elements.

* * * * *